(12) United States Patent
Tsai et al.

(10) Patent No.: US 10,120,425 B2
(45) Date of Patent: Nov. 6, 2018

(54) GUIDE FOR A COMPUTING DEVICE CHASSIS

(71) Applicant: LENOVO Enterprise Solutions (Singapore) PTE. LTD., New Tech Park (SG)

(72) Inventors: Ming-Wang Tsai, Taipei (TW); Chang-Hsing Lee, New Taipei (TW); Jui-Chieh Guo, Taipei (TW); Sung-Feng Chen, Taipei (TW); Yen Hao Wei, New Taipei (TW)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/604,426

(22) Filed: May 24, 2017

(65) Prior Publication Data
US 2017/0344083 A1    Nov. 30, 2017

(30) Foreign Application Priority Data
May 24, 2016 (CN) .......................... 2016 1 0350087

(51) Int. Cl.
*G06F 1/20* (2006.01)
*G06F 1/18* (2006.01)

(52) U.S. Cl.
CPC ................ *G06F 1/20* (2013.01); *G06F 1/181* (2013.01); *G06F 1/183* (2013.01)

(58) Field of Classification Search
CPC ......... H01R 13/629; H01R 31/06; G06F 1/20; G06F 1/18; G06F 1/181; G06F 1/183; G06F 1/186; G06F 1/187; G06F 1/188; H05K 7/026; H05K 7/10
USPC ....... 361/679.48, 679.02, 823, 826; 439/533, 439/629, 491
See application file for complete search history.

(56) References Cited

U.S. PATENT DOCUMENTS 6,053,586 A * 4/2000 Cook .................... E05B 65/006
292/146

\* cited by examiner

*Primary Examiner* — Mandeep S Buttar
(74) *Attorney, Agent, or Firm* — Kunzler, PC

(57) ABSTRACT

A computing device includes a chassis having at least one connector configured to receive a component, and a guide coupled to the chassis. The guide includes a guide element and is selectively movable relative to the chassis to arrange the guide element at a first position which allows a first variant of the component to be connected with the at least one connector and prevents a second variant of the component to be connected thereto, and a second position which allows the second variant of the component to be connected with the at least one connector and prevents the first variant of the component to be connected thereto.

19 Claims, 15 Drawing Sheets

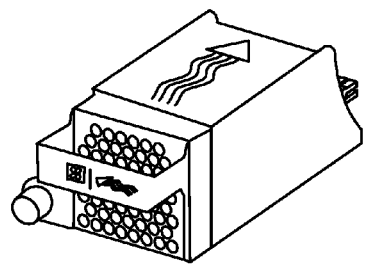 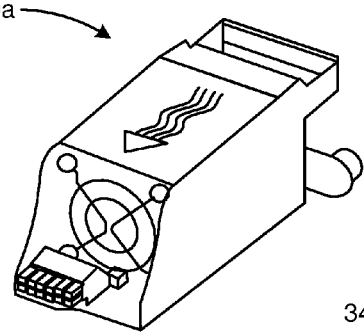 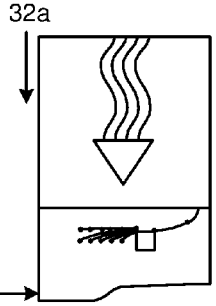
FIG. 3A    FIG. 3B    FIG. 3C
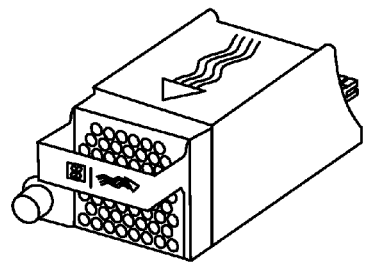 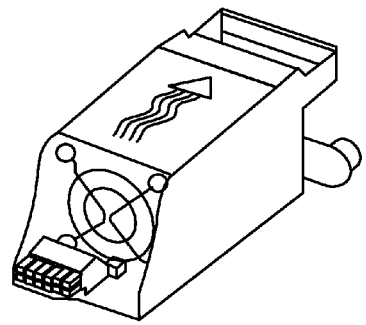 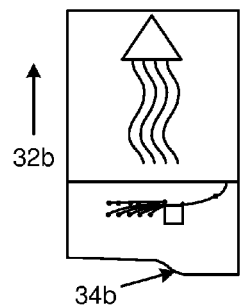
FIG. 4A    FIG. 4B    FIG. 4C

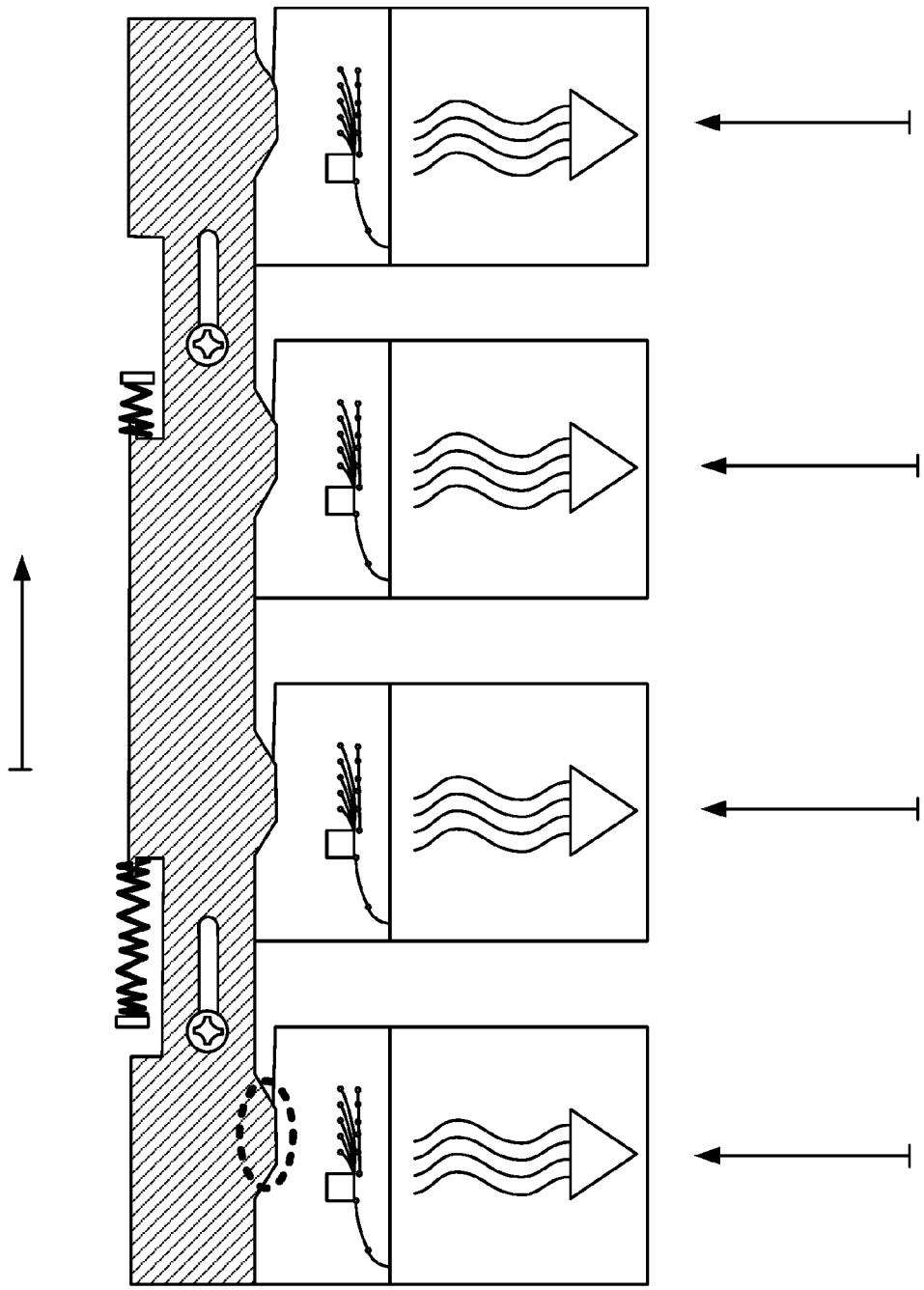

GUIDE FOR A COMPUTING DEVICE CHASSIS

CROSS-REFERENCE TO RELATED APPLICATIONS

This patent application claims priority to Chinese Patent Application No. CN 201610350087.4 filed on May 24, 2016 for Ming-Wang Tsai, et al., the entire contents of which are incorporated herein by reference for all purposes.

FIELD

The present disclosure relates to a guide for a computing device chassis, and in particular, a guide for fitting a component to the computing device chassis.

BACKGROUND

A computer chassis is a casing of a computer for housing hardware components of the computer. There are usually multiple components that need to be fitted in the chassis. The components may be of different types, such as fan modules and hard-drives, or even different variants of a same type of component, such as air intake fan modules and air exit fan modules. The variants may be of the same dimension and have outer casings of the same configuration, as shown in FIG. 1, making it difficult to differentiate among variants of a component. The connectors of the respective variants may also have a same configuration 50 such that both can be plugged into a same designated connector on the chassis, as illustrated by FIGS. 2B and 2C. However, there may be serious consequences if a wrong variant of a component is installed. For example, if a wrong variant of a fan is fitted into a server computer, it may affect thermal management of the server computer, or even resulting in malfunction or shutdown of the server as a result of overheating of the server or thermal damages of other components of the server computer.

There are existing ways of differentiating the variants of a component (for example, fans) so as to guide a user to connect a correct variant to the computer chassis. As shown in FIG. 1, visual aids such as labels or pad prints 60 may be provided on the casing of the fans to indicate a variant of the fan module. Another way of differentiating the variants is by providing a handle at a different location of the respective fan casings, depending on the variant of the fan. This is illustrated by FIGS. 2A and 2B. The air exit fan (the one on the left in FIGS. 2A and 2B) is provided with a handle 70 which is located adjacent to the top surface of the casing of the fan when the fan is orientated in its normal working position. On the other hand, a handle 80 of the air intake fan (the one shown on the right in FIGS. 2A and 2B) is provided adjacent to the bottom surface of the casing. Visual aids such as an arrow indicating a direction of air flow and a text label corresponding to the fan variant are also provided on the fan casings.

However, existing solutions remain unsatisfactory as the user may still mix up the two variants and fit a wrong variant into the chassis. In other words, the wrong variant may be inadvertently connected to the chassis which causes potential damages of the computer. Therefore, it is desirable to provide a guide which facilitates connection of a correct variant or component to the computer chassis.

BRIEF SUMMARY

A computing device includes a chassis having at least one connector configured to receive a component, and a guide coupled to the chassis. The guide includes a guide element and is selectively movable relative to the chassis to arrange the guide element at a first position which allows a first variant of the component to be connected with the at least one connector and prevents a second variant of the component to be connected thereto, and a second position which allows the second variant of the component to be connected with the at least one connector and prevents the first variant of the component to be connected thereto.

An apparatus includes a computing device chassis with at least one connector, and a guide. The guide includes a guide element. The guide is selectively movable relative to the computing device chassis to arrange the guide element at a first position which allows a first variant of the component to be connected with the at least one connector and prevents a second variant of the component to be connected thereto, and a second position which allows the second variant of the component to be connected with the at least one connector and prevents the first variant of the component to be connected thereto.

A method includes engaging a guide with a computing device chassis. The computing device chassis includes at least one connector for connecting with the component. The guide has a guide element and is selectively movable relative to the computing device chassis. The method includes moving the guide to arrange the guide element at a position which allows the component to be connected with the connector and prevents a variant of the component to be connected with the connector, and connecting the component with the connector.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 3A is a rear perspective view of a first variant of a component used in an embodiment of a method for selective coupling;

FIG. 3B is a front perspective view of the first variant;

FIG. 3C is a top view of the first variant;

FIG. 4A is a rear perspective view of a second variant of a component used in an embodiment of a method for selective coupling;

FIG. 4B is a front perspective view of the second variant;

FIG. 4C is a top view of the second variant;

FIG. 6B is a diagram illustrating a second part of exemplary operations of a guide with two components with a first variant according to the embodiment of FIG. 5.

DETAILED DESCRIPTION

Figure 1:
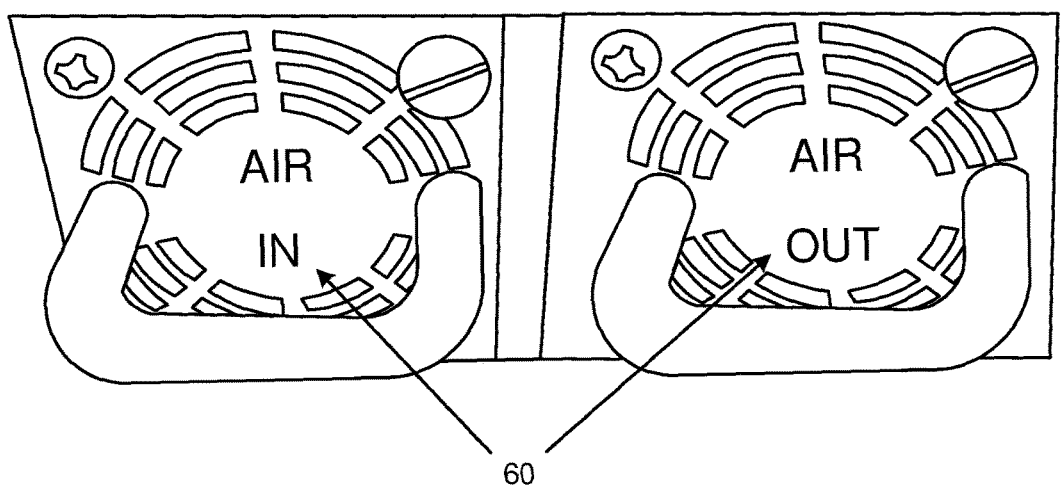
FIG. 1 is a schematic block diagram illustrating a prior art method for guiding a connection between a component and a computer chassis.
Figure 2A:
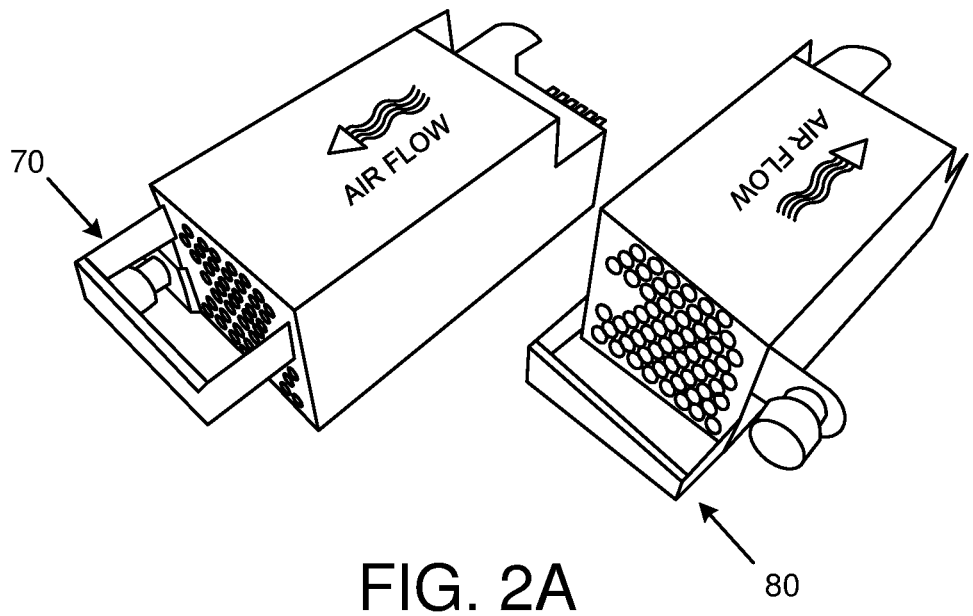
FIG. 2A is a schematic block diagram illustrating a front perspective view of prior art components.
Figure 2B:
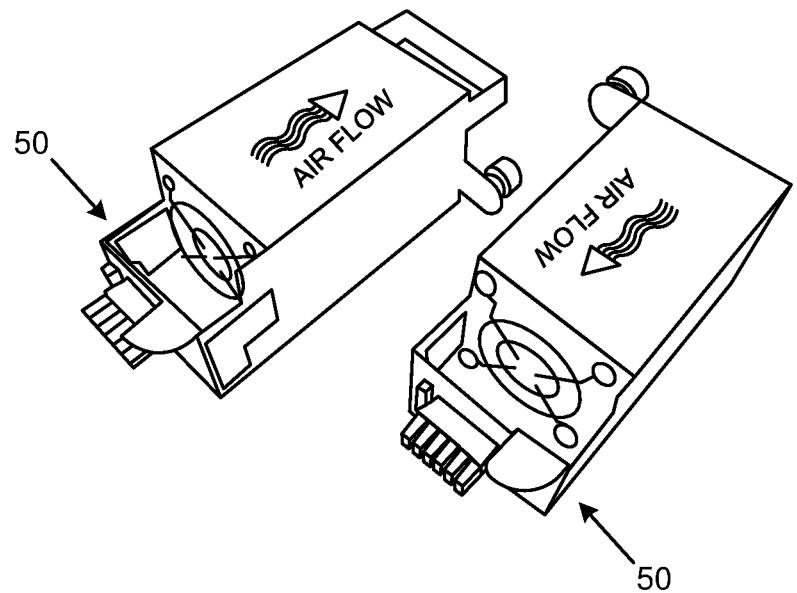
FIG. 2B is a schematic block diagram illustrating a rear perspective view of prior art components.
Figure 2C:
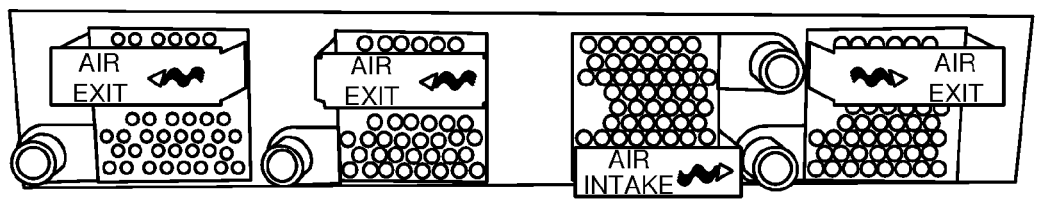
FIG. 2C is a schematic block diagram illustrating a front view of prior art components installed in a chassis.

Aspects of the embodiments are described below with reference to schematic block diagrams of methods, apparatuses and systems according to embodiments. It will be understood that each block of the schematic flowchart diagrams and/or schematic block diagrams, and combinations of blocks in the schematic flowchart diagrams and/or schematic block diagrams, can be implemented in multiple ways.

The schematic flowchart diagrams and/or schematic block diagrams in the Figures illustrate the architecture, functionality, and operation of possible implementations of apparatuses, systems and methods according to various embodiments.

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware.

The description of elements in each figure may refer to elements of proceeding figures. Like numbers refer to like elements in all figures, including alternate embodiments of like elements.

A computing device includes a chassis having at least one connector configured to receive a component, and a guide coupled to the chassis. The guide includes a guide element and is selectively movable relative to the chassis to arrange the guide element at a first position which allows a first variant of the component to be connected with the at least one connector and prevents a second variant of the component to be connected thereto, and a second position which allows the second variant of the component to be connected with the at least one connector and prevents the first variant of the component to be connected thereto.

In one embodiment, the guide is urged to move to the first or second position in response to one of the first variant of the component being connected with the at least one connector, and the second variant of the component being connected with the at least one connector respectively. In another embodiment, the chassis includes a plurality of connectors and the guide includes a plurality of guide elements corresponding to respective ones of the plurality of connectors of the chassis. All the guide elements are simultaneously urged to respective first or second positions to allow connection of each connector with a correct variant of the component and prevent connection of each connector with an incorrect variant of the component in response to the guide being moved relative to the chassis. In another embodiment, the chassis includes a plurality of connectors and the guide includes a plurality of guide elements corresponding to respective ones of the plurality of connectors of the chassis. In response to the first variant of the component being connected with one of the connectors, the guide is urged to move the plurality of guide elements to positions which allow the first variant of the component to connect with the remaining connectors and prevent the second variant of the component to connect with the remaining connectors.

In some embodiments, the at least one connector includes a slot and the guide element is resiliently biased at a center of the slot. In another embodiment, the computing device includes a component connected to the at least one connector. The component comprises an indicator positioned based on the component's variant, and wherein in response to the guide being moved relative to the chassis, the guide element is moved to a position to match the position of the indicator of the component allowed to be connected with the at least one connector. In another embodiment, the indicator is shaped to fit the guide element. In another embodiment, the indicator includes a first slope and the guide element comprises a second slope, and wherein the first and second slopes are caused to slide against each other to move the guide in response to the component being connected with the at least one connector.

In one embodiment, the guide includes an engaging element configured for slottable engagement with the chassis. In another embodiment, the guide includes a first and second stopper configured to resist movement of the guide to prevent movement of the guide element beyond the first and second positions respectively. In another embodiment, the guide includes a first guide element configured for a first type of the component and a second guide element configured for a second type of the component. The first and second types of the component include different dimensions. In another embodiment, the first and second guide elements are located on a same side of the guide. In another embodiment, the first and second guide elements are located on opposite sides of the guide. In another embodiment, the chassis includes a first and second connectors corresponding to the first and second guide elements respectively, and in response to the guide being moved relative to the chassis, the first and second guide elements are urged to positions which simultaneously allow both the first and second connectors to be connected with correct variants of the respective types of components and prevent both the first and second connectors from connecting with incorrect variants of the respective types of components.

In one embodiment, the guide element is adjustable relative to the guide. In another embodiment, the at least one connector includes a slot and the guide is longitudinal and extends perpendicular to a longitudinal axis of the slot to extend the guide element into the slot. In another embodiment, the component includes a fan, and the first variant of the component includes a clockwise rotating fan and the second variant of the component includes a counter-clockwise rotating fan. In another embodiment, the computing device is a computer server.

An apparatus includes a computing device chassis with at least one connector, and a guide. The guide includes a guide element. The guide is selectively movable relative to the computing device chassis to arrange the guide element at a first position which allows a first variant of the component to be connected with the at least one connector and prevents a second variant of the component to be connected thereto, and a second position which allows the second variant of the component to be connected with the at least one connector and prevents the first variant of the component to be connected thereto.

A method includes engaging a guide with a computing device chassis. The computing device chassis includes at least one connector for connecting with the component. The guide has a guide element and is selectively movable relative to the computing device chassis. The method includes moving the guide to arrange the guide element at a position which allows the component to be connected with the connector and prevents a variant of the component to be connected with the connector, and connecting the component with the connector.

Figure 5:
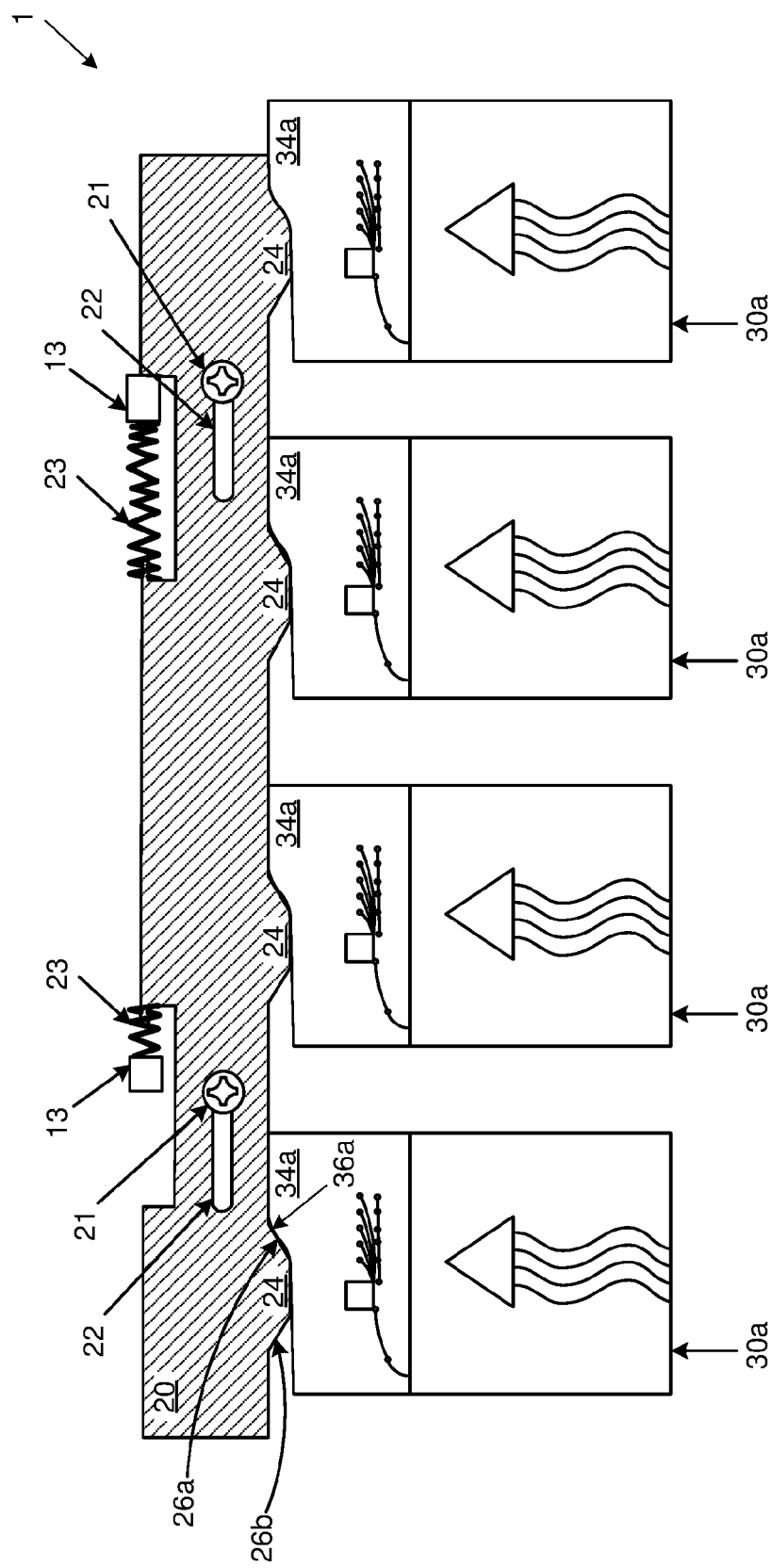
FIG. 5 is a top sectional view of a portion of a computer server according to one embodiment of a method for selective coupling.

FIG. 5 is a top sectional view of a portion of a computer server 1 according to one embodiment. The server 1 has a chassis 10 for housing hardware components in the server 1. In the embodiment below, the hardware components are fan modules, such as air intake fan 30a and air exit fan 30b (as illustrated in FIGS. 3 and 4), which are configured to be fitted to the chassis 10. In particular, the chassis 10 has corresponding connectors in the form of slots configured to receive the fan modules (30a or 30b). The fan modules 30a, 30b are plugged into the respective slots of the chassis 10 to form appropriate connections (such as electrical connections and/or mechanical connections) with the chassis 10.

Referring to FIGS. 3 and 4, the fan modules 30a, 30b have two variants characterized by its air intake/exit property. The air intake fan 30a is configured to generate an air flow from the rear to the front (indicated by arrow 32a and the arrow on the air intake fan 30a) of the chassis 10, whereas the air exit fan 30b is configured to generate an air flow (indicated by 32b and the arrow on the air exit van 30b) from the front to the rear of the chassis 10. The air intake fan 30a and the air exit fan 30b rotate in opposite directions (i.e. clockwise and anti-clockwise) or are positioned in opposite directions to generate the air flow in opposite directions. An indicator 34a, 34b is provided at a casing of respective fan 30a, 30b. The indicators 34a, 34b are positioned differently with respect to the respective casings of the fan module, such as at opposite corners of the casings. In this example, the indicator 34a for the air intake fan 30a is in a form of a planar extension located at a lower left corner of the casing in the embodiment shown in FIG. 3C. The indicator 34b for the air exit fan 30b is in similarly in a form of a planar extension located at a lower right corner of the casing in the embodiment shown in FIG. 4C. It will be understood that the indicators 34a, 34b may take other forms and may be provided at other locations of the fan modules.

A guide in form of a bar 20 is coupled to the chassis 10 by screws 21 disposed via openings 22 in a body of the bar 20. The bar 20 is slidable relative to the chassis 10 along a direction defined by the openings 22. In this example, the bar 20 is longitudinal and has a plurality of guide elements 24 arranged at regular intervals along a lengthwise direction of bar 20. The bar 20 may be moved relative to the chassis 10 such that the guide elements 24 are moved to match the positions of the indicators 36a of the air intake fans 30a.

In the example as shown in FIG. 5, the shape of the indicator 34a fits that of the guide element 24. In particular, the indicator 34a has a slope 36a and the guide element 24 has a corresponding slope 26a such that the two slopes 36a and 26a are slidable to allow a smooth relative movement between the air intake fan 30a and the bar 20. In a variant, other forms of indicators and/or guide elements may be employed to interact with each other. For example, a male-type connector may be provided as the indicator and a corresponding female-type receptor may be provided as the guide element such that they can only engage when their positions match.

Figure 6A:
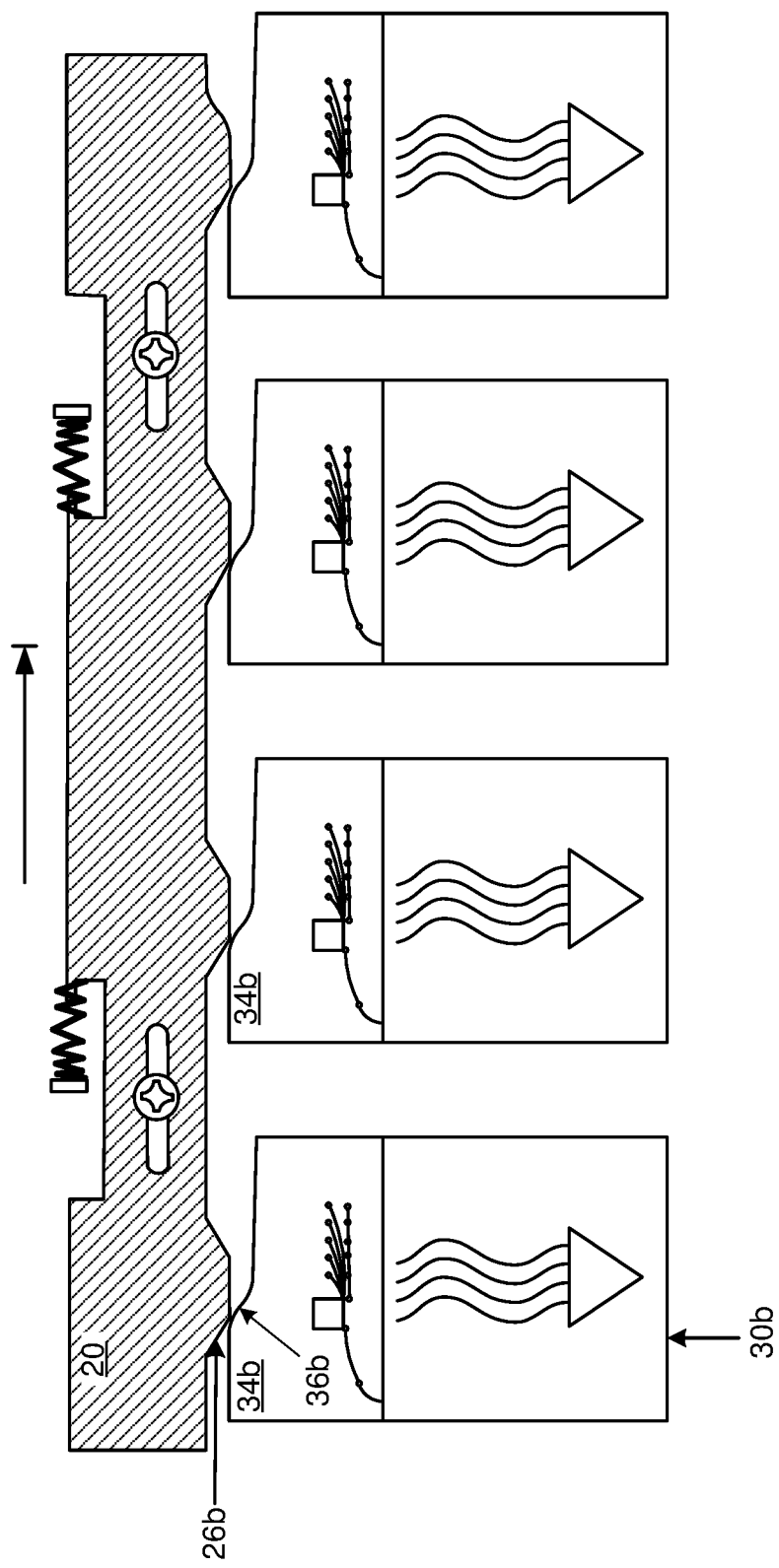
FIG. 6A is a diagram illustrating a first part of exemplary operations of a guide with two components with a first variant according to the embodiment of FIG. 5.

The bar 20 in the above example may be used for fitting the air exit fan 30b to the chassis 10. Similarly, the indicator 34b has a slope 36b and the guide element 24 has a corresponding slope 26b to allow slidable movement between the air exit fan 30b and the bar 20. Referring to FIG. 6A, upon the air exit fan 30b on the left being plugged into a slot of the chassis 10, the indicator 36b slides against the slope 26b of guide element 24 thereby displacing the bar 20 to the right. This moves the remaining guide element 24 (the guide element 24 on the right as shown in FIGS. 6A and 6B) to a first position which allows the adjacent air exit fan 30b to connect with the chassis 10.

In the example above, it is not required to manually move the bar 20 before inserting the air exit fan 30b. This may help increase the efficiency of assembling the server 1. Moreover, by just one movement of the bar 20, the guide elements 24 are displaced to the right positions simultaneously to receive the corresponding variant of the fan modules. This embodiment eliminates the need to move each guide element 24 separately.

Figure 6C:
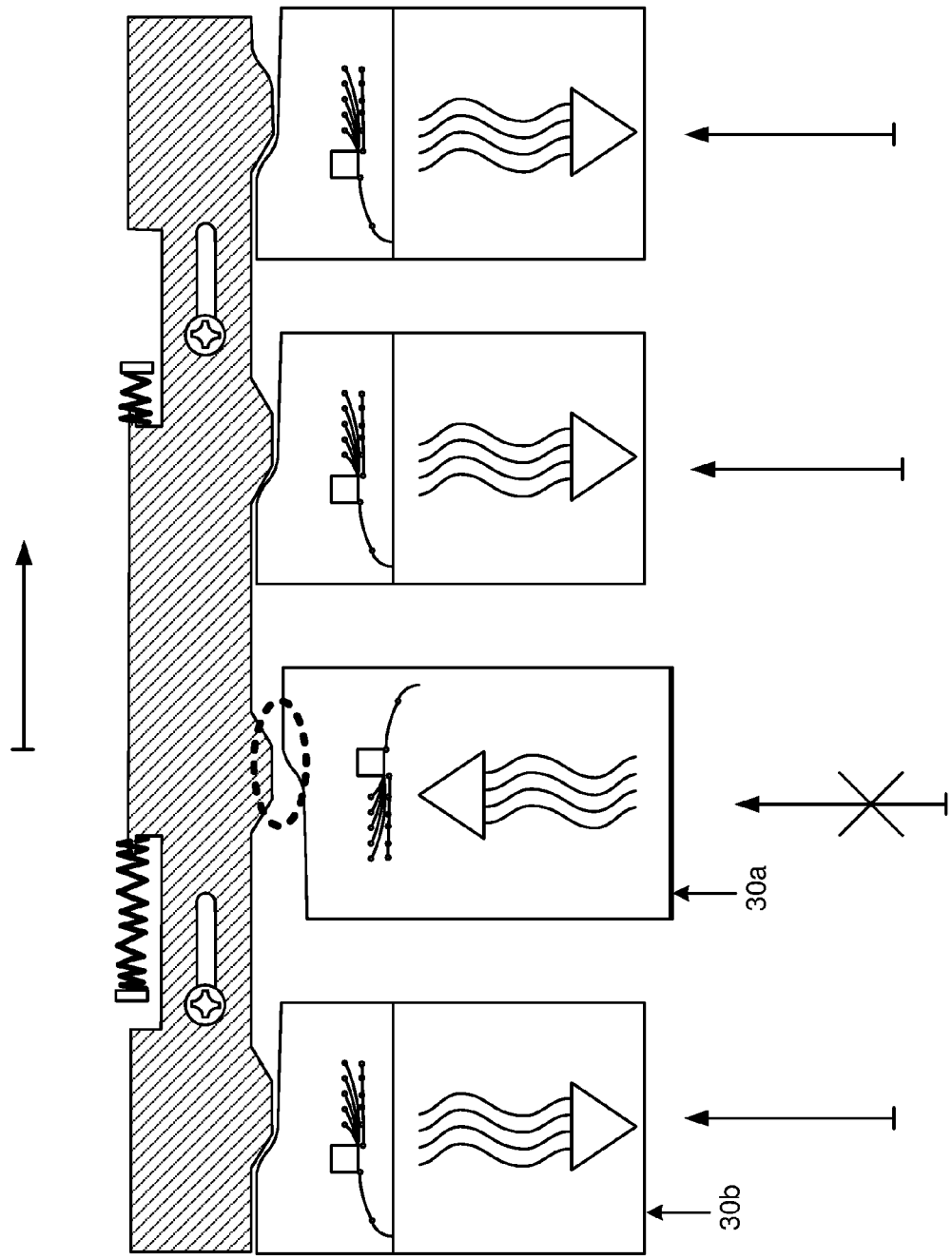
FIG. 6C is a diagram illustrating exemplary operations of a guide with two components with a first component with a variant and a second component with a second variant according to the embodiment of FIG. 5.

Additionally, as illustrated by FIG. 6C, the configuration of the guide element 24 blocks an air intake fan 30a from engaging the slot of the chassis 10. This helps prevent a replacement part of an incorrect variant, e.g. the air intake fan 30a, from being inserted into the slot. For example, during maintenance of the server 1, when one of the fan modules needs replacement and is removed from its slot, the guide element 24 corresponding to this slot is held in the same position by the fan modules engaged in other slots. This guide element 24 may ensure that the fan module will be replaced by with a correct variant.

In another mode of operation, if the air intake fan 30a is plugged into a slot of the chassis, the bar 20 will likewise be urged to the left thereby moving the guide elements 24 to their respective second positions which allow an adjacent air intake fan 30*a*, and prevent the other variant of the fan module, the air exit fan 30*b*, to connect with the chassis 10.

In the above embodiment, the screws 21 cooperate with the openings 22 to control a displacement of the bar 20. In particular, the movement of the bar 20 beyond pre-defined positions will be stopped by the screws 21 such that the guide elements 24 are movable in a controlled range (i.e. between the first and second position). In other embodiments, another element, such as stops (not shown) are included that prevent movement of the guide elements 24 from moving beyond a controlled range. The screws 21 or stops retain the guide elements 24 in their respective ranges of positions which are operable to allow one variant of the fan modules to connect with the slot of the chassis and prevent the other variant from being connected.

In other words, as the bar 20 is moved relative to the chassis 10, all the guide elements 24 may be simultaneously urged to the desired positions to allow connection of a slot with a correct variant of the fan modules and prevent connection with one of an incorrect variant, in response to the bar 20 being moved relative to the chassis 10. In this example, the bar 20 is longitudinal and extends perpendicular to a longitudinal axis of the slot of the chassis. The guide elements 24 are arranged to extend into the slot. It will be understood that the guide may take a different shape than the longitudinal bar described in the exemplary embodiments.

In this embodiment, the bar 20 further has springs 23 which is slottably engageable with the chassis 10, for example, via designated fixtures 13 provided on the chassis 10. The springs 23 resiliently bias the bar 20 to a neutral position with respect to the chassis 10. For example, the bar 20 may be biased to a position such that the guide elements 24 are maintained at the center of the respective slots of the chassis 10. In yet another example, the bar 20 may be biased such that the guide elements 24 stay at the first or second positions until the user moves the bar 20 or until a different variant of the fan modules is plugged in. Note that in another embodiment, the bar 20 is coupled to the bar 20 to the chassis 10 by the springs 23, without using the screws 21. The springs 23 may also resist a movement of the bar 20 to exert control on the displacement of the guide elements 24.

The above exemplary embodiments allow the computing device chassis to have the same design for fitting of both variants of the fan modules (or variants of another other type of hardware components). In other words, the same bar 20 can be used for either variant depending on the direction along which the bar 20 is moved. This may allow the manufacturing process of the computing device to be simplified, for example, as compared to providing guide elements in a particular pattern, which are fixed with respect to the chassis. In particular, the chassis of the present embodiment may simply include slots to engage the bar 20 at locations designated for the hardware components. By moving the bars engaged at these locations in different directions, some locations can be set for use with the hardware components in one variant while others can be set for use with ones in the other variant.

In the embodiment shown in FIG. 5, the guide elements 24 of bar 20 are arranged such that each of them receives fan modules of a same variant, for example multiple fans all of which are either the air exit fans 30*b*, or the air intake fans 30*a*. In other words, the guide elements 24 are configured to guide the fitting of the air intake fans 30*a* (or the air exit fans 30*b*) upon the bar 20 being pushed to the left (or right) in response to a first air intake fan 30*a* (or the air exit fan 30*b*) being plugged into the slot.

In another embodiment, the guide elements 24 may be arranged to receive fan modules of different variants, or even to receive hardware components of different types, as will be described in more detail below.

Figure 7:
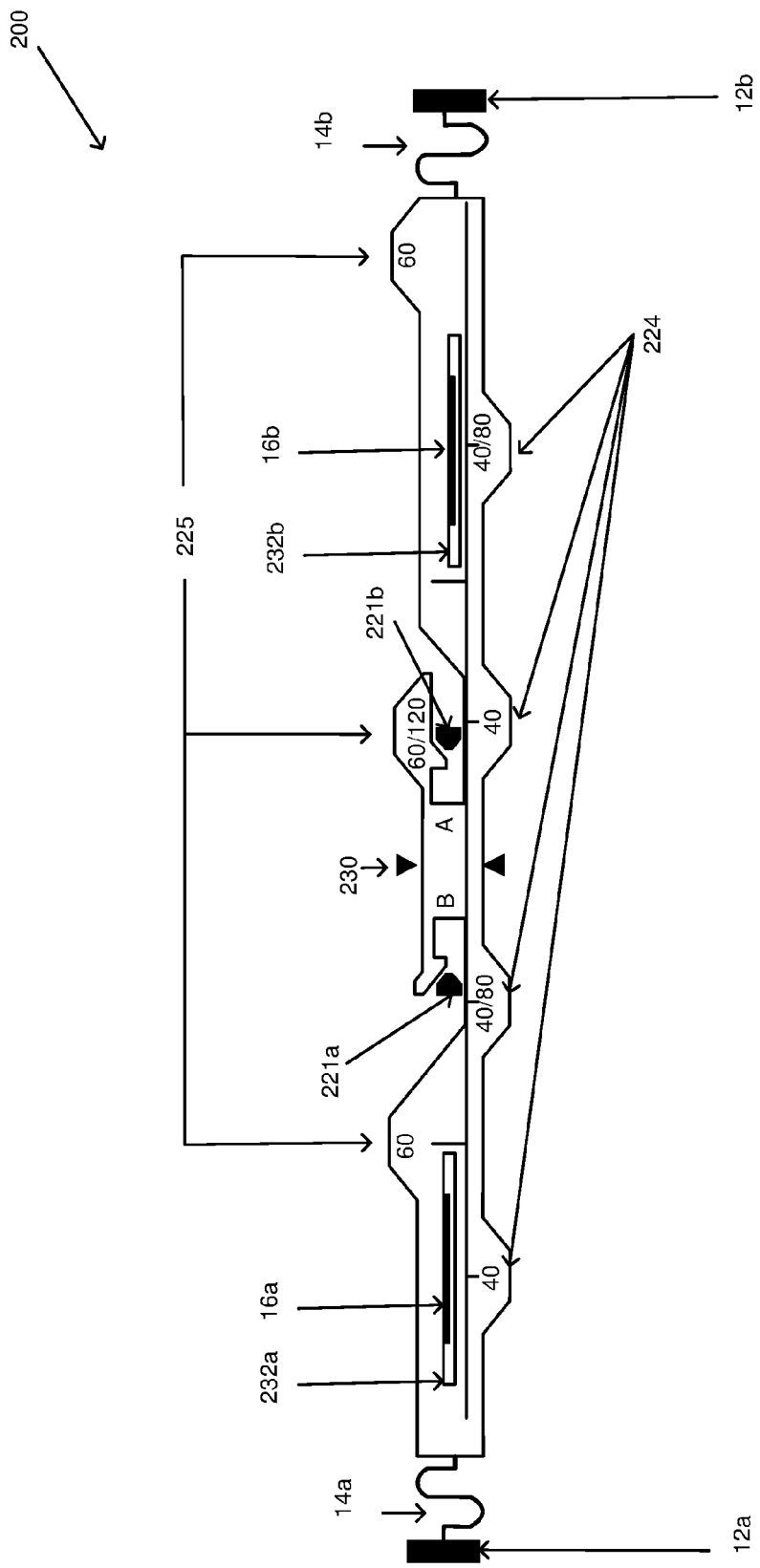
FIG. 7 is a diagram illustrating one embodiment of a guide.
Figure 8:
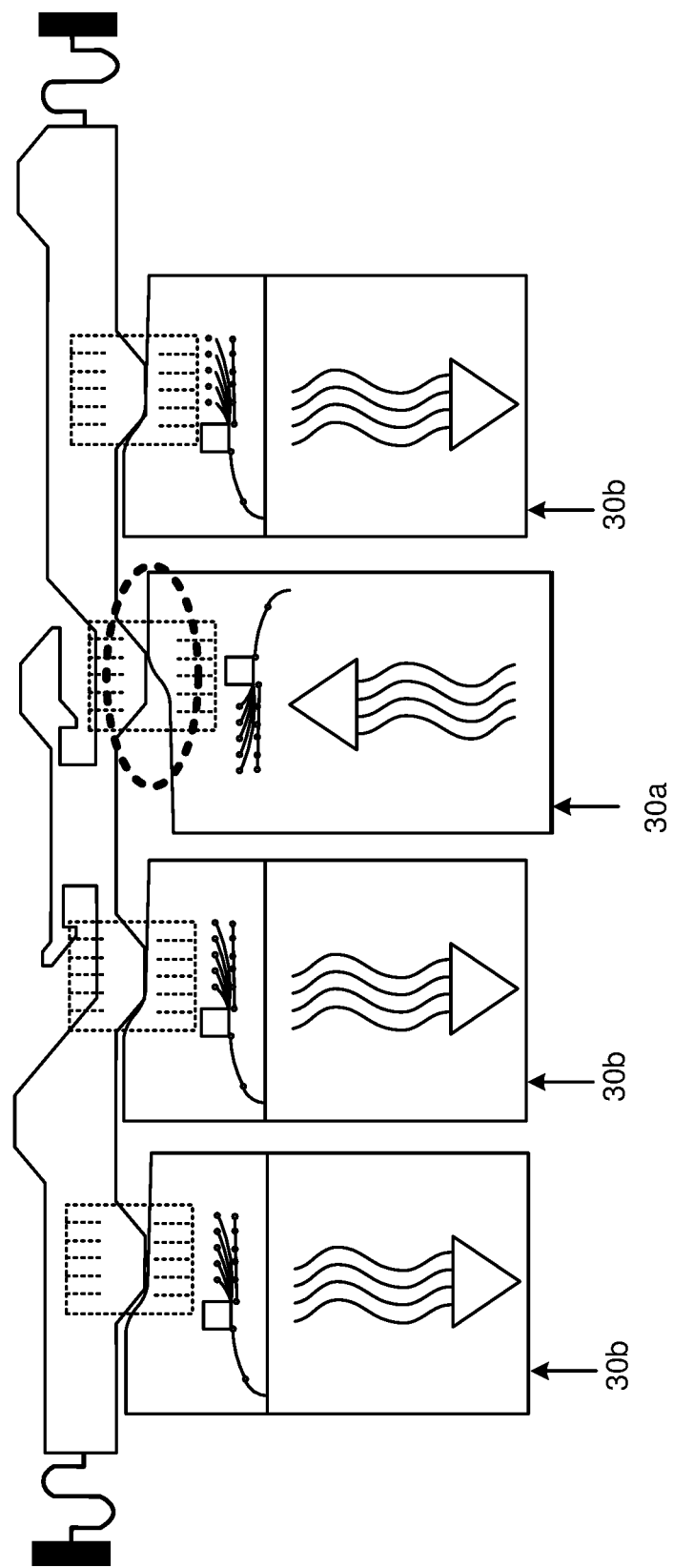
FIG. 8 is a top sectional view of a portion of a computer server according to another embodiment.

FIG. 7 illustrates another embodiment of the guide. A bar 200 is coupled to each of two opposing walls 12*a*, 12*b* of the chassis 10 via a respective resilient element in form a spring 14*a*, 14*b*. The bar 200 is further maintained in place with respect to the chassis by two support walls 16*a*, 16*b* extending through respective openings 232*a*, 232*b* in a body portion of the bar 200. The bar 200 is movable relative to the chassis 10 accompanied by a compression of the spring 14*a*, 14*b* against the respective wall 12*a*, 12*b*. In this particular example, the bar 200 is made slidable relative to the chassis 10 along a direction defined by the openings 232*a*, 232*b*. The bar 200 has a plurality of first guide elements 224 arranged at regular intervals along a lengthwise direction of the bar 200. Similarly, the first guide elements 224 facilitate engagement between a correct variant of the fan modules and the chassis 10 while preventing a wrong variant from engaging with the chassis 10. This is illustrated by FIG. 8, in which the first guide elements 224 guide connections between the air exit fans 30*b* and the chassis 10 while preventing the air intake fan 30*a* from connecting with the chassis 10.

A mode indicator 230 is provided for the bar 200 for indicating a position of the bar 200 with respect to the chassis 10, as will be described later. Stoppers 221*a*, 221*b* are arranged with respective to the bar 200 to maintain the bar 200 at predefined positions with respect to the chassis 10.

Figure 9:
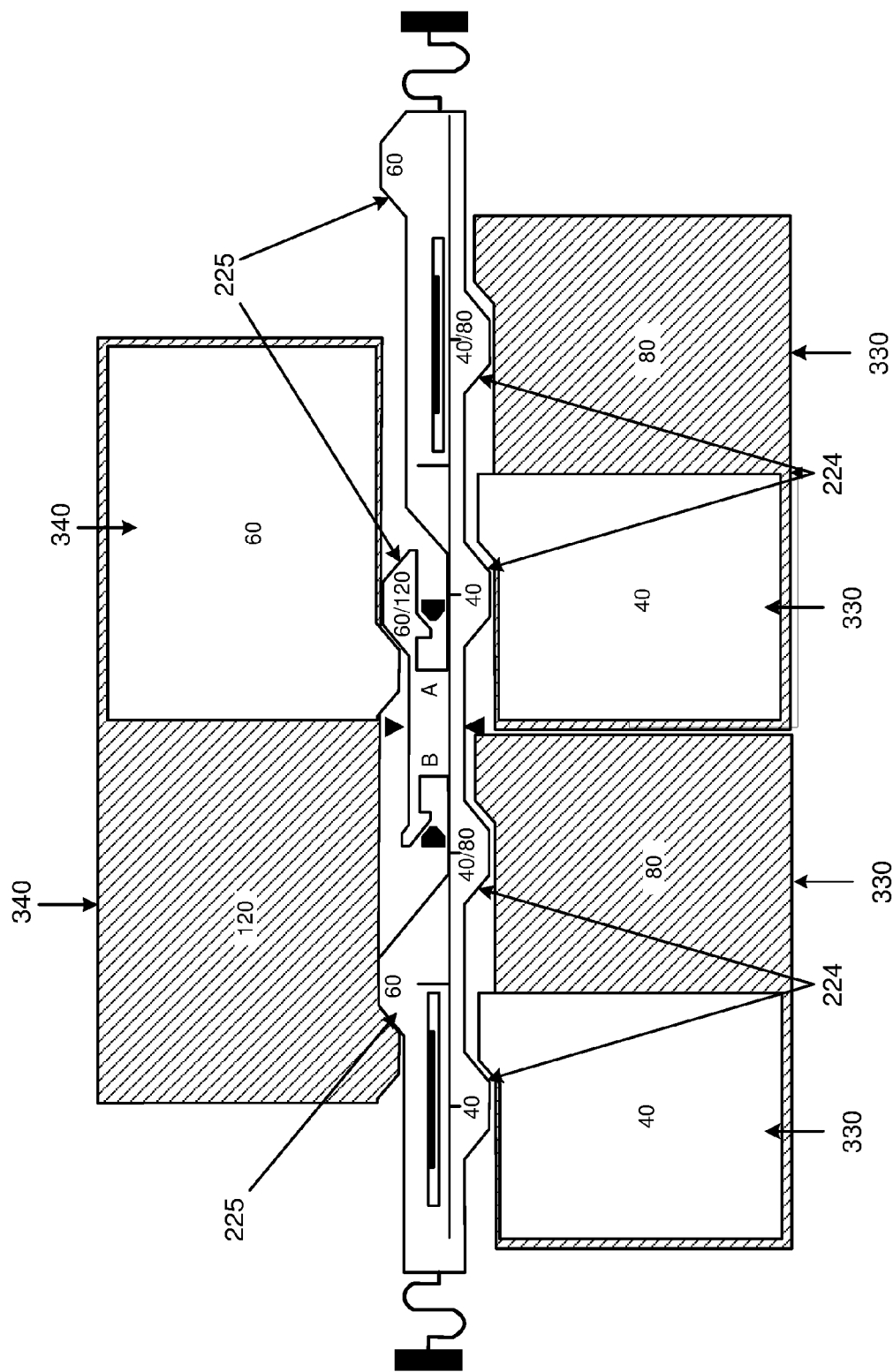
FIG. 9 schematically illustrates components which are guided to be connected to the chassis by the guide of FIG. 7.

In this embodiment, there are also a plurality of second guide elements 225 disposed at one side of the bar 200 opposite to the first elements 224. The first and second guide elements 224, 225 are configured for hardware components of different dimensions. This may be achieved by providing the respective sets of guide elements at an appropriate interval to accommodate a corresponding type of components. As shown in FIG. 9, the first guide elements 224 are for fitting fan modules 330 having a first dimension (e.g. a 40/80 pitch fan), whereas the second guide elements 225 are for fitting fan modules 340 having a second dimension (e.g. a 60/120 pitch fan). In a variant, the second guide elements 225 may be provided on the same side of the first guide elements 224. In other words, guide elements configured for guiding components of different types (e.g. those have different dimensions) may be provided on a same side of the bar 200.

Figure 10A:
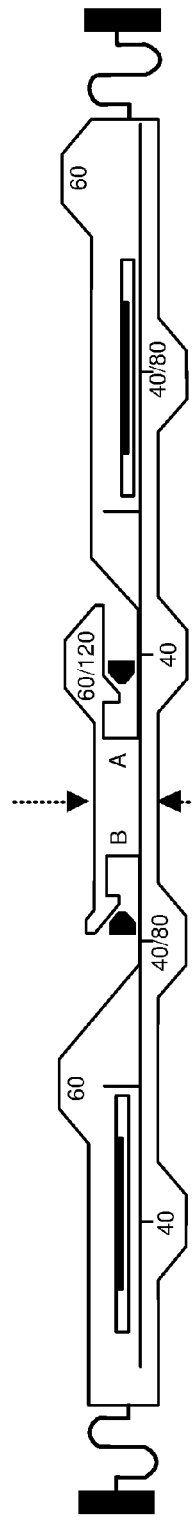
FIG. 10A illustrates a first part of exemplary operations of the guide of FIG. 7 when in use.
Figure 10B:
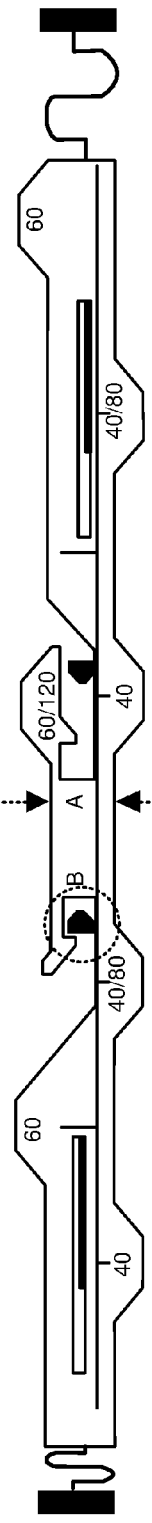
FIG. 10B illustrates a second part of exemplary operations of the guide of FIG. 7 when in use.
Figure 10C:
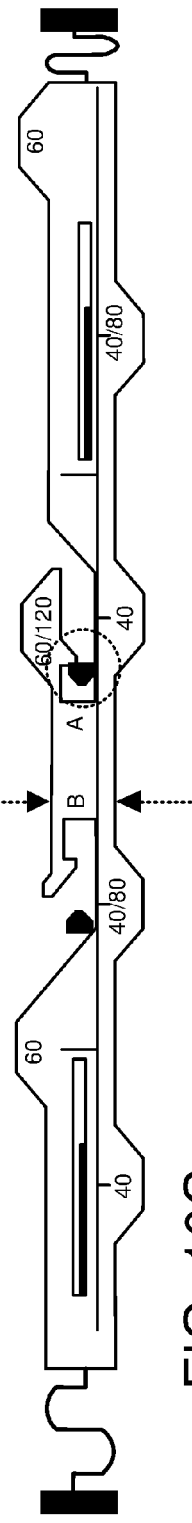
FIG. 10C illustrates a third part of exemplary operations of the guide of FIG. 7 when in use.

FIG. 10 illustrates exemplary operations of the bar 200 when in use. FIG. 10A shows the bar 200 in a resting position. Upon the bar 200 being moved to the left, as shown in FIG. 10B, the spring 14*a* is urged against the wall 12*a* of the chassis. It will be understood that the bar 200 may be moved manually by a user, or as a result of an intended component being fitted to the chassis 10, as described in the above embodiments. As the bar 200 is displaced to the left beyond a pre-defined position, the stopper 221*a* may abut against a portion of the bar 200 to prevent the bar 200 from being urged to the right due to the compressed spring 14*a*. This holds the bar 200 in the first position (indicated as mode "A" by the mode indicator 230), even if no manual force is exerted on the bar 200. Similarly, as shown in FIG. 10C, the stopper 221*b* prevents the bar 200 from returning the resting position as the bar 200 is displaced to the right in the second position (indicated as mode "B" by the mode indicator 230). In other words, the bar 200 can be selectively moved to and held at a desired position such that the respective guide elements 224 stay in their respective positions to guide the connection of the desired components to the chassis 10.

Therefore, the first and second guide elements 224, 225 may be urged to positions which simultaneously allow corresponding slots of the chassis 10 to be connected with correct variant of the respective types of components and also prevent the slots from connecting with incorrect variant of the respective types of components. In the above embodiments, the bar 200 is configured to move between two different positions, namely the first and second position. In a variant, the guide may be configured to stop at another position (e.g. an intermediate position between the first and second position) for fan modules of other different pitches.

Figure 11:
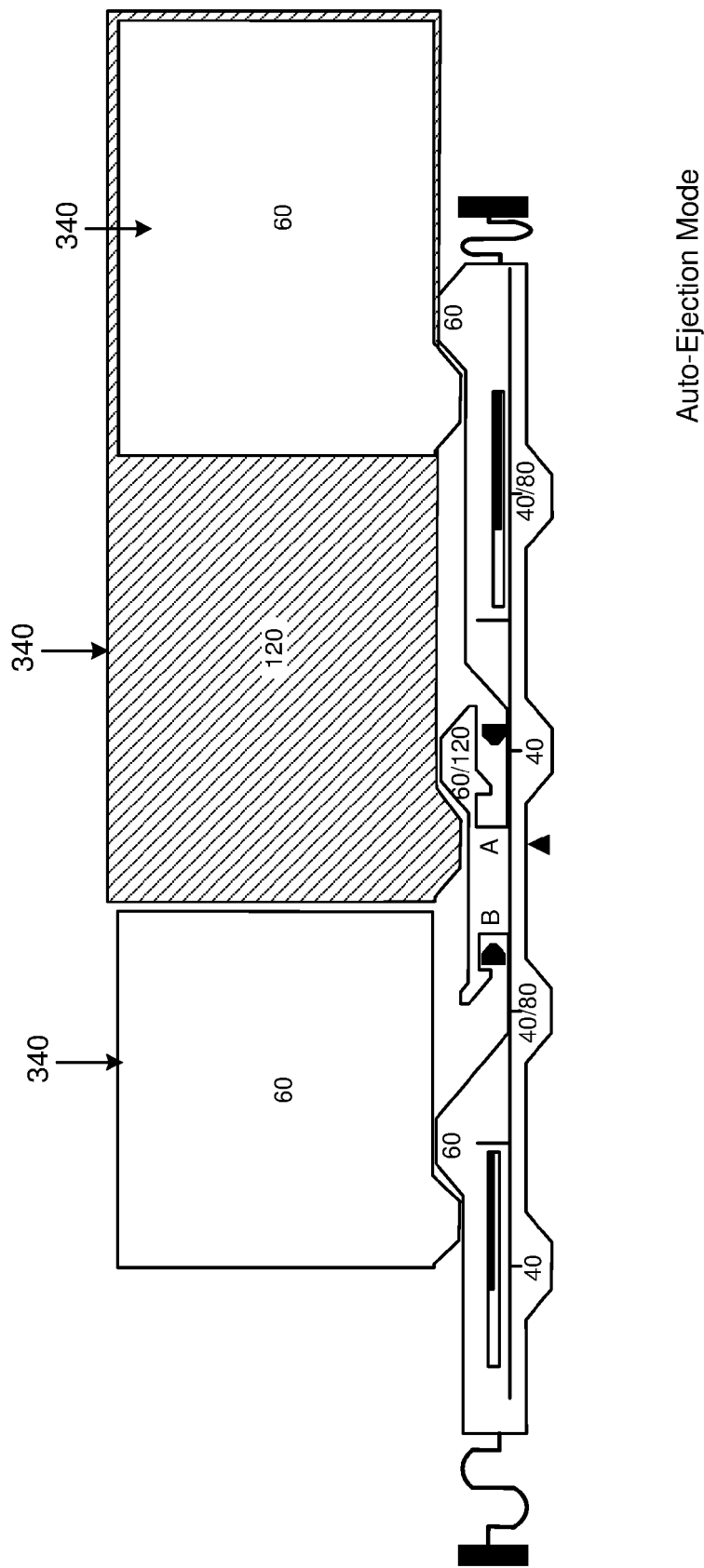
FIG. 11 illustrates another possible operation of the guide of FIG. 7.

FIG. 11 illustrates another possible operation of the bar 200. In particular, when the fan modules 340 are in engagement with the chassis 10, the bar 200 may be moved relative to the chassis 10 to cause the fan modules 340 to be disengaged or ejected from the chassis 10. As shown in FIG. 11, upon the bar 200 being moved to the right, the guide elements slides to the right against the indicator of the component thereby displacing the fan modules 340 downwardly away from bar 200. This causes the fan modules 340 to disconnect and eject from the slots of the chassis 10. This may happen in response to the user manually moving the bar 200, or in response to the first guide elements 225 on the opposite side of the bar 200 being displaced upon connection of the fan modules 330 to the chassis 10.

Figure 12:
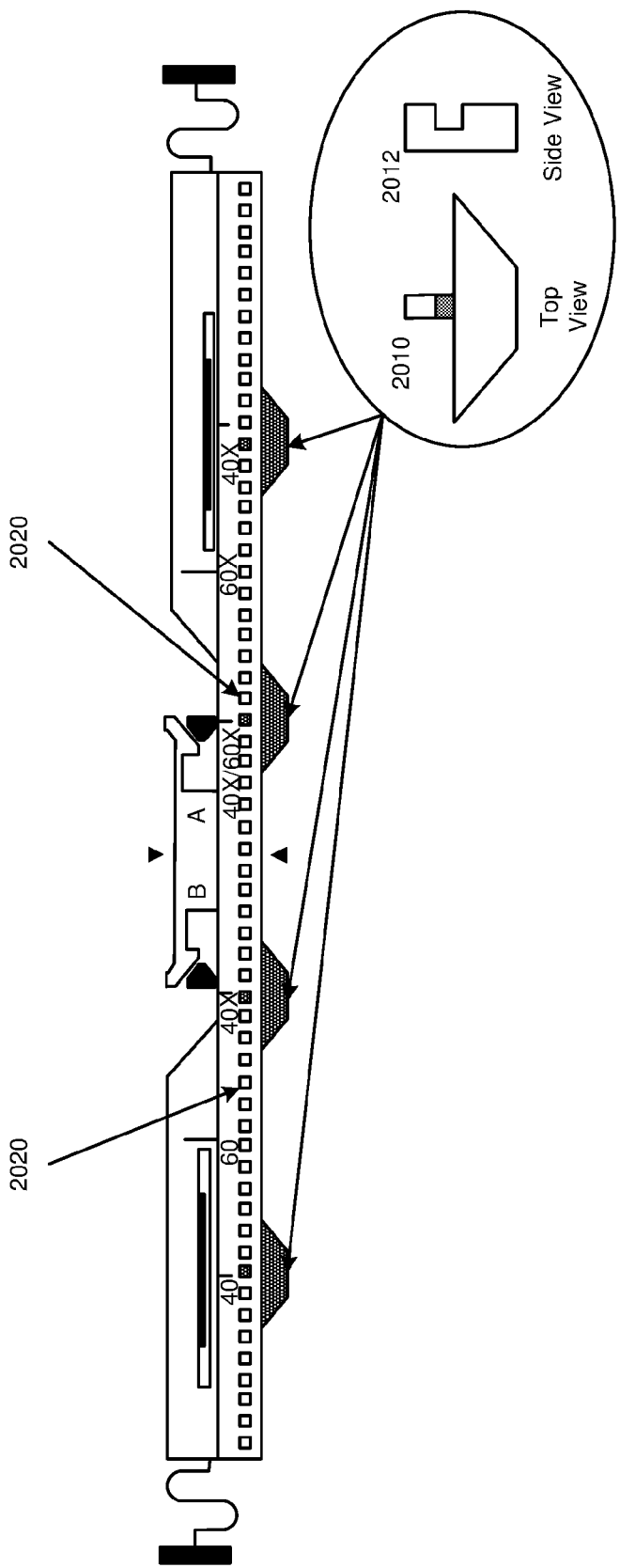
FIG. 12 schematically illustrates a guide according to a further embodiment.

In some embodiments, positions of the guide element are adjustable with respect to the guide, as illustrated below. Referring to FIG. 12, guide elements in form of removable inserts 2010 are provided for a bar 2000. The bar 2000 has a plurality of holes 2020 disposed at regular intervals along a lengthwise direction of the bar 2000. Each of the holes 2020 is configured to receive the insert 2010 via a hook portion 2012 of the insert 2010. By arranging the inserts 2010 at respective holes 2020 at selected positions of the bar 2000, the inserts 2010 may be appropriately positioned and spaced to guide one or more desired components for fitting into the chassis 10. This allows for a great flexibility in configuring the bar 2000 with guide elements of any desired arrangements for accommodating components of a range of quantity and/or dimensions. This may be useful since a computing device typically has components of different dimensions to be fitted into the chassis. They may be fitted into the chassis at different spacing (i.e. spacing between individual components), too. Thus, providing a guide with guide elements which can be flexibly disposed at different intervals allows for the guide to be customized for the computing device to guide the connection of the components on demand by the user.

Figure 13:
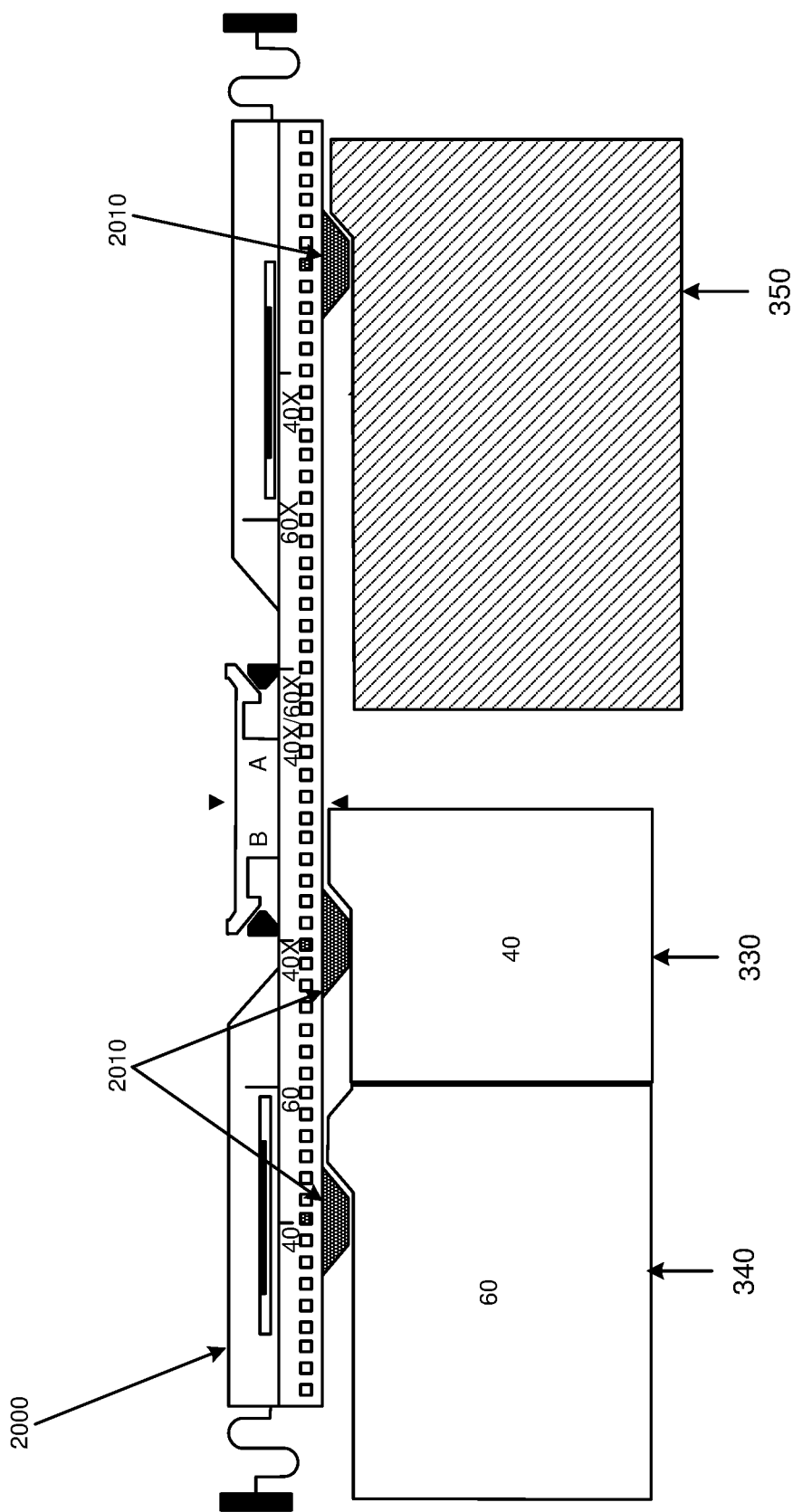
FIG. 13 schematically illustrates components which are guided to be connected to the chassis by the guide of FIG. 12.

As illustrated by FIG. 13, the bar 2000 may be arranged to guide multiple components 330, 340, 350 of different dimensions by placing the inserts 2010 with respect to the bar 2000 at corresponding different intervals.

Whilst the foregoing description has described exemplary embodiments, it will be understood by those skilled in the art that many variations of the embodiment can be made within the scope and spirit of the present invention. For example, the server may have only one slot to receive one hardware component instead of multiple slots. The hardware components may be other types of components, and not limited to fan modules, of a computing device.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computing device comprising:
   a chassis having at least one connector configured to receive a component; and
   a guide coupled to the chassis,
   wherein the guide comprises a guide element and is selectively movable relative to the chassis to arrange the guide element at
      a first position which allows a first variant of the component to be connected with the at least one connector and prevents a second variant of the component to be connected thereto; and
      a second position which allows the second variant of the component to be connected with the at least one connector and prevents the first variant of the component to be connected thereto.

2. The computing device of claim 1, wherein the guide is urged to move to the first or second position in response to one of
   the first variant of the component being connected with the at least one connector; and
   the second variant of the component being connected with the at least one connector respectively.

3. The computing device of claim 1, wherein the chassis comprises a plurality of connectors and the guide comprises a plurality of guide elements corresponding to respective ones of the plurality of connectors of the chassis, and wherein all the guide elements are simultaneously urged to respective first or second positions to allow connection of each connector with a correct variant of the component and prevent connection of each connector with an incorrect variant of the component in response to the guide being moved relative to the chassis.

4. The computing device of claim 1, wherein the chassis comprises a plurality of connectors and the guide comprises a plurality of guide elements corresponding to respective ones of the plurality of connectors of the chassis, and wherein in response to the first variant of the component being connected with one of the connectors, the guide is urged to move the plurality of guide elements to positions which allow the first variant of the component to connect with the remaining connectors and prevent the second variant of the component to connect with the remaining connectors.

5. The computing device of claim 1, wherein the at least one connector comprises a slot and the guide element is resiliently biased at a center of the slot.

6. The computing device of claim 1, further comprising a component connected to the at least one connector, wherein the component comprises an indicator positioned based on the component's variant, and wherein in response to the guide being moved relative to the chassis, the guide element is moved to a position to match the position of the indicator of the component allowed to be connected with the at least one connector.

7. The computing device of claim 6, wherein the indicator is shaped to fit the guide element.

8. The computing device of claim 7, wherein the indicator comprises a first slope and the guide element comprises a second slope, and wherein the first and second slopes are caused to slide against each other to move the guide in response to the component being connected with the at least one connector.

9. The computing device of claim 1, wherein the guide further comprises a first and second stopper configured to resist movement of the guide to prevent movement of the guide element beyond the first and second positions respectively.

10. The computing device of claim 1, wherein the guide comprises a first guide element configured for a first type of the component and a second guide element configured for a second type of the component, the first and second types of the component having different dimensions.

11. The computing device of claim 10, wherein the first and second guide elements are located on a same side of the guide.

12. The computing device of claim 10, wherein the first and second guide elements are located on opposite sides of the guide.

13. The computing device of claim 10, wherein the chassis comprises a first and second connectors corresponding to the first and second guide elements respectively, and wherein in response to the guide being moved relative to the chassis, the first and second guide elements are urged to positions which simultaneously allow both the first and second connectors to be connected with correct variants of the respective types of components and prevent both the first and second connectors from connecting with incorrect variants of the respective types of components.

14. The computing device of claim 1, wherein the guide element is adjustable relative to the guide.

15. The computing device of claim 1, wherein the at least one connector comprises a slot and wherein the guide is longitudinal and extends perpendicular to a longitudinal axis of the slot to extend the guide element into the slot.

16. The computing device of claim 1, wherein the component comprises a fan, the first variant of the component comprising a clockwise rotating fan and the second variant of the component comprising a counter-clockwise rotating fan.

17. The computing device of claim 1, wherein the computing device is a computer server.

18. An apparatus comprising:
a computing device chassis comprising at least one connector; and
a guide comprising a guide element, the guide being selectively movable relative to the computing device chassis to arrange the guide element at
a first position which allows a first variant of the component to be connected with the at least one connector and prevents a second variant of the component to be connected thereto; and
a second position which allows the second variant of the component to be connected with the at least one connector and prevents the first variant of the component to be connected thereto.

19. A method comprising: engaging a guide with a computing device chassis, the computing device chassis comprising at least one connector for connecting with the component, the guide having a guide element and selectively movable relative to the computing device chassis, the guide element at: a first position which allows a first variant of the component to be connected with the at least one connector and prevents a second variant of the component to be connected thereto; and a second position which allows the second variant of the component to be connected with the at least one connector and prevents the first variant of the component to be connected thereto; moving the guide to arrange the guide element at a position which allows the component to be connected with the connector and prevents a variant of the component to be connected with the connector; and connecting the component with the connector.

* * * * *